United States Patent
Benjamin et al.

(10) Patent No.: US 12,368,057 B2
(45) Date of Patent: Jul. 22, 2025

(54) ENHANCED CLOSED LOOP GAS BASED HEAT EXCHANGE

(71) Applicant: Lam Research Corporation, Fremont, CA (US)

(72) Inventors: Neil Martin Paul Benjamin, Palo Alto, CA (US); John Stephen Drewery, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 181 days.

(21) Appl. No.: 17/920,018

(22) PCT Filed: Apr. 19, 2021

(86) PCT No.: PCT/US2021/027995
§ 371 (c)(1),
(2) Date: Oct. 19, 2022

(87) PCT Pub. No.: WO2021/216462
PCT Pub. Date: Oct. 28, 2021

(65) Prior Publication Data
US 2023/0170227 A1 Jun. 1, 2023

Related U.S. Application Data

(60) Provisional application No. 63/012,697, filed on Apr. 20, 2020.

(51) Int. Cl.
*F04F 5/00* (2006.01)
*F04F 5/16* (2006.01)
(Continued)

(52) U.S. Cl.
CPC .......... *H01L 21/67017* (2013.01); *F04F 5/16* (2013.01); *F24F 7/06* (2013.01);
(Continued)

(58) Field of Classification Search
CPC ............... H01L 21/67; H01L 21/67242; H01L 21/67109; H01L 21/67248;
(Continued)

(56) References Cited

U.S. PATENT DOCUMENTS

| 4,373,344 | A | | 2/1983 | Hinn | |
|---|---|---|---|---|---|
| 5,335,503 | A | * | 8/1994 | Lee | ........................... F25D 3/10 62/239 |

(Continued)

FOREIGN PATENT DOCUMENTS

| CN | 104078301 A | 10/2014 |
|---|---|---|
| CN | 115443526 | 12/2022 |

(Continued)

OTHER PUBLICATIONS

"Japanese Application Serial No. 2022-563346, Voluntary Amendment filed Apr. 10, 2024", w English claims, 15 pgs.

(Continued)

*Primary Examiner* — Harry E Arant
(74) *Attorney, Agent, or Firm* — Schwegman Lundberg & Woessner, P.A.

(57) ABSTRACT

A temperature control system comprises an enclosure having an intake aperture and an exhaust aperture. An air amplifier disposed inside the enclosure. A gas supply line is connected to the air amplifier through the intake aperture. The gas supply line supplies a first flow of gas to the air amplifier. The air amplifier amplifies the first flow of gas to a second flow of gas inside the enclosure. The second flow of gas exits through the exhaust aperture.

20 Claims, 10 Drawing Sheets

(51) Int. Cl.
  *F24F 7/06* (2006.01)
  *H01L 21/67* (2006.01)
  *F24F 110/20* (2018.01)
  *F24F 110/40* (2018.01)

(52) U.S. Cl.
  CPC ..... *H01L 21/67248* (2013.01); *F24F 2110/20* (2018.01); *F24F 2110/40* (2018.01)

(58) Field of Classification Search
  CPC .......... H01L 21/67253; H01L 21/67017; F24F 7/06; F24F 2110/20; F24F 2110/40; F04F 5/46; F04F 5/48; F04F 5/16
  See application file for complete search history.

(56) References Cited

U.S. PATENT DOCUMENTS

| | | | |
|---|---|---|---|
| 2013/0087283 A1 | 4/2013 | McChesney et al. | |
| 2013/0128455 A1* | 5/2013 | Koblenz | H05K 7/20836 165/294 |
| 2014/0217895 A1 | 8/2014 | Busche et al. | |
| 2014/0273796 A1 | 9/2014 | Giammattei et al. | |
| 2015/0260350 A1 | 9/2015 | Smith | |
| 2016/0270259 A1* | 9/2016 | Chainer | H05K 7/20272 |

FOREIGN PATENT DOCUMENTS

| | | |
|---|---|---|
| JP | S5755012 U | 3/1982 |
| JP | S57148844 U | 9/1982 |
| JP | H224592 U | 2/1990 |
| JP | H0729869 A | 1/1995 |
| JP | 2004225945 A * | 8/2004 |
| JP | 2009086181 A | 4/2009 |
| JP | 201040719 A | 2/2010 |
| JP | 2010040719 | 2/2010 |
| JP | 2011258761 A | 12/2011 |
| JP | 2013519192 A | 5/2013 |
| JP | 2016146438 A | 8/2016 |
| JP | 2017005128 A | 1/2017 |
| JP | 2023522349 | 5/2023 |
| KR | 20020041734 A | 6/2002 |
| KR | 20180074276 A | 7/2018 |
| WO | WO-2021216462 A1 | 10/2021 |

OTHER PUBLICATIONS

"Korean Application Serial No. 10-2022-7039812, Voluntary Amendment filed Apr. 16, 2024", w English claims, 5 pgs.
International Application Serial No. PCT/US2021/027995, International Search Report mailed Aug. 2, 2021, 3 pgs.
International Application Serial No. PCT/US2021/027995, Written Opinion mailed Aug. 2, 2021, 7 pgs.
"International Application Serial No. PCT US2021 027995, International Preliminary Report on Patentability mailed Nov. 3, 2022", 9 pgs.
Japanese Application Serial No. 2022-563346, Notification of Reasons for Refusal mailed Feb. 12, 2025, w/ English Translation, 10 pgs.
"Japanese Application Serial No. 2022-563346, Response filed May 9, 2025 to Notification of Reasons for Refusal mailed Feb. 12, 2025", w English Claims, 15 pgs.
"Korean Application Serial No. 10-2022-7039812, Notice of Preliminary Rejection mailed Apr. 25, 2025", w English Translation, 13 pgs.

* cited by examiner

US 12,368,057 B2

ENHANCED CLOSED LOOP GAS BASED HEAT EXCHANGE

CLAIM OF PRIORITY

This application is a U.S. National Stage Filing under 35 U.S.C. 371 from International Application No. PCT/US2021/027995, filed on Apr. 19, 2021, and published as WO 2021/216462 A1 on Oct. 28, 2021, which claims the benefit of priority to U.S. Patent Application Ser. No. 63/012,697, filed on Apr. 20, 2020, each of which is incorporated by reference herein in its entirety.

TECHNICAL FIELD

The present application relates generally to the technical field of a temperature control system, and, in various embodiments, to an enhanced closed loop gas-based heat exchange using mass flow amplification.

BACKGROUND

Semiconductor processing systems are generally used to process semiconductor wafers for fabrication of integrated circuits. In a specific example, cooling electronic devices (in an enclosure below the dew point of fab air) requires gas to be purged out of the enclosure to avoid ice or moisture formation.

A conventional system uses a flow of incoming gas free of the undesirable contaminant (e.g., moisture). Thermal control is by warming or cooling of the gas. Heat transport is via the specific heat of the gas. Because the gas flow is relatively low (e.g. <30 standard liter per minute (slpm)), the heat exchange is relatively inefficient. Low flow velocity also leads to low heat transfer coefficients and restricted heat removal capability. Other prior methods of thermal control use a liquid coolant or direct thermal contact with a heat sink, but in many applications these cannot be used due to the presence of high electrical fields in the enclosure.

FIG. 1 is a block diagram depicting a cross-section of an enclosure, according to a prior art. The electronic components 106 that requires thermal control are disposed inside an enclosure 102. An intake tube 108 is connected the enclosure 102 and allows a gas to flow (e.g., purge flow 104) inside the enclosure 102. The purge flow 104 enters the enclosure 102 through the intake tube 108 and exits the enclosure 102 through the exhausts 110. However, the aperture of the exhausts 110 also restricts the purge flow 104 and forms positive pressure inside the enclosure 102.

The background description provided here is for the purpose of generally presenting the context of the disclosure. Work of the presently named inventors, to the extent that it is described in this background section, as well as aspects of the description that may not otherwise qualify as prior art at the time of filing, are neither expressly nor impliedly admitted as prior art against the present disclosure.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The description that follows describes systems, methods, techniques, instruction sequences, and computing machine program products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided.

The present disclosure describes a temperature control system of an enclosure. For example, electronic components can be cooled in an enclosure to a temperature below the dew point of fab air. This requires air to be purged out of the enclosure to avoid ice or moisture formation.

The present disclosure describes a temperature control system comprising an air amplifier disposed inside the enclosure. Instead of incoming gas passing directly into the enclosure, the incoming gas is used to drive the air amplifier. The air amplifier causes a larger mass flow of gas to circulate within the enclosure. This circulation greatly enhances heat transfer from the components inside the enclosure. In another example embodiment, the temperature control system further includes a heater applied to the exterior walls of the enclosure. In yet another example embodiment, the walls of the enclosure may further incorporate thermal control elements (e.g. cooling loops). In yet another example embodiment, the temperature control system includes fins (or other surface increasing area) features inside the enclosure on which the flow from the air amplifier impinges. The fins are designed to further enhance the heat transfer of the components inside the enclosure.

In one example embodiment, a temperature control system comprises an enclosure having an intake aperture and an exhaust aperture. An air amplifier disposed inside the enclosure. A gas supply line is connected to the air amplifier through the intake aperture. The gas supply line supplies a first flow of gas to the air amplifier. The air amplifier amplifies the first flow of gas to a second flow of gas inside the enclosure. The second flow of gas exits through the exhaust aperture.

Figure 1:
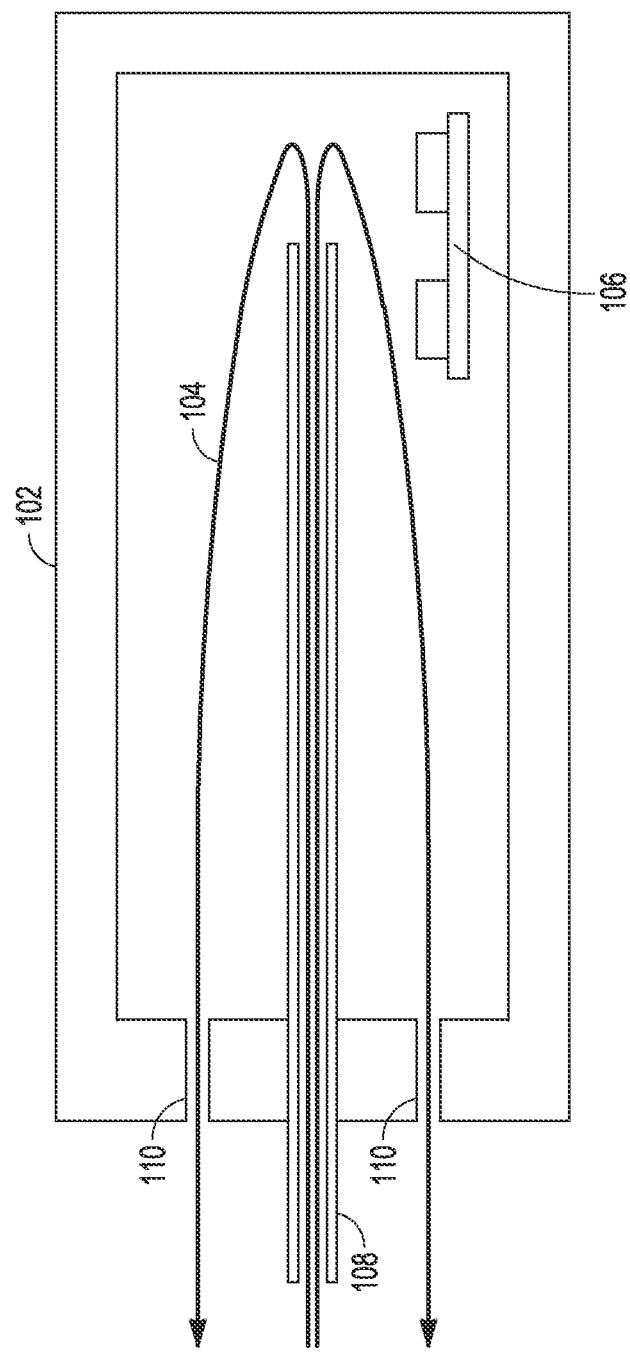
FIG. 1 illustrates an enclosure in accordance with a prior art.
Figure 2:
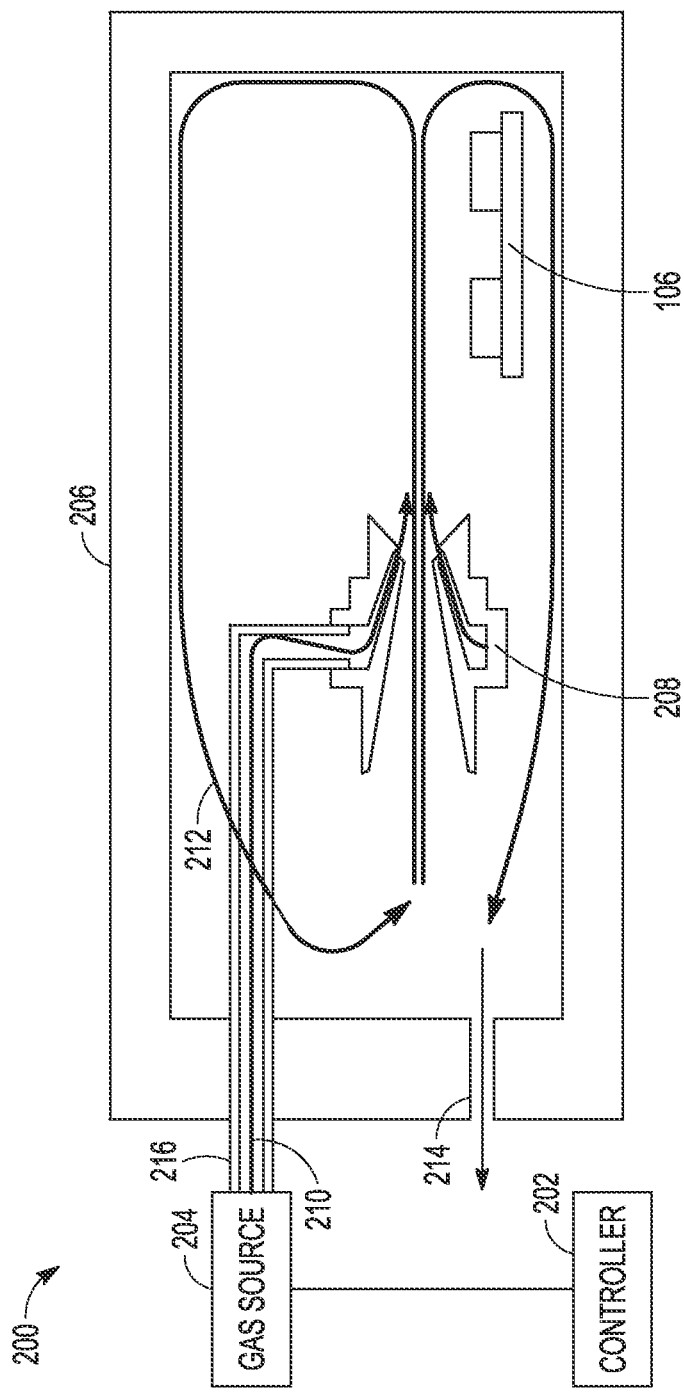
FIG. 2 is a block diagram illustrating an enclosure system in accordance with one example embodiment.

FIG. 2 is a block diagram illustrating enclosure system 200 in accordance with one example embodiment. The enclosure system 200 comprises an electronic components 106, a controller 202, a gas source 204, an enclosure 206, an air amplifier 208, a first gas flow 210, an enhanced purge flow 212, an exhaust 214, and a gas supply line 216.

The gas source 204 provides a first gas flow 210 to the air amplifier 208 via the gas supply line 216. The air amplifier 208 is disposed inside the enclosure 206 and amplifies the first gas flow 210 into an enhanced purge flow 212.

The air amplifier 208 is a component that increases or amplifies air flow. The air amplifier 208 moves a large amount of air by creating a uniform, focused, high velocity blast of air that draws in surrounding air for an amplified output. In particular, the gas source 204 uses the Coanda effect to amplifies the air output.

The first gas flow 210 drives the air amplifier 208 to generate the enhanced purge flow 212 inside the enclosure 206. The intensity of the enhanced purge flow 212 is based on the intensity of the first gas flow 210. The greater gas velocity of the enhanced purge flow 212 improves heat transfer of the electronic components 106 disposed inside the enclosure 206. The controller 202 is coupled to the gas source 204 and controls a rate of the first gas flow 210. Therefore, the controller 202 can increase or decrease the intensity of the enhanced purge flow 212 by adjusting the rate of the first gas flow 210 from the gas source 204. In one example embodiment, the controller 202 controls the rate of the first flow of gas to purge the enclosure 206 of contaminants. In another example embodiment, the controller 202 increases the rate of the first flow of gas when the humidity detected by the humidity sensor is greater than a predetermined threshold.

The enclosure 206 further includes the exhaust 214 to provide an outlet for the enhanced purge flow 212 to escape the enclosure 206. In another embodiment, the exhaust 214 includes an adjustable aperture or a flow regulator to control a flow of gas coming out of the exhaust 214. The controller 202 can control the exhaust 214 to increase or decrease the escape of gas out of the exhaust 214.

Figure 3:
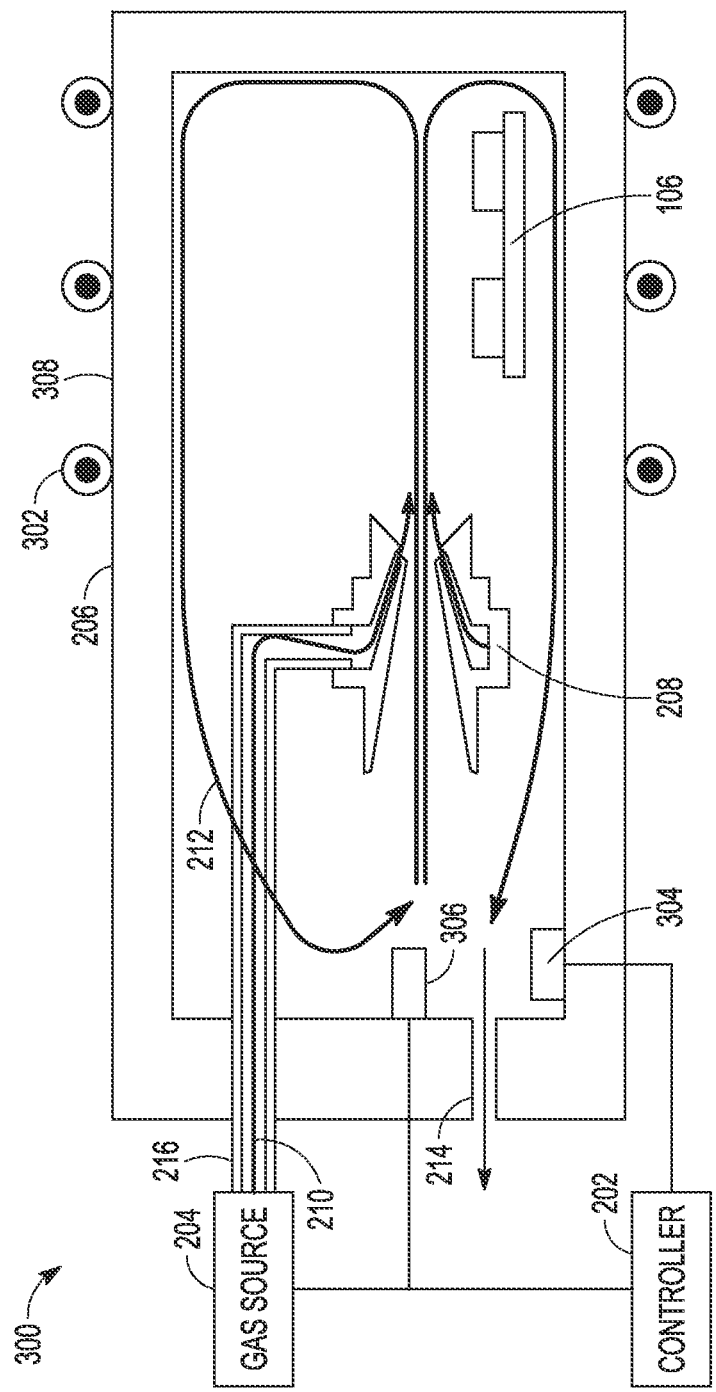
FIG. 3 is a block diagram illustrating an enclosure system in accordance with another example embodiment.

FIG. 3 is a block diagram illustrating an enclosure system 300 in accordance with another example embodiment. The enclosure system 300 comprises an electronic components 106, a controller 202, a gas source 204, an enclosure 206, an air amplifier 208, a first gas flow 210, an enhanced purge flow 212, an exhaust 214, a gas supply line 216, a heating/cooling elements 302, a pressure sensor 304, and a humidity and temperature sensor 306.

The heating/cooling elements 302 are thermally coupled to an outer wall 308 of the enclosure 206. The heating/cooling elements 302 may include one of a thermal control component such as heaters, temperature regulating fluids, thermal conduction to another body, or a combination thereof.

The pressure sensor 304 and humidity and temperature sensor 306 are placed inside the enclosure 206 and measure a pressure, a humidity level, and a temperature inside the enclosure 206. The pressure sensor 304 and the humidity and temperature sensor 306 are connected to the controller 202. In one example embodiment, the controller 202 controls an intensity of the first gas flow 210 based on at least one of the pressure, the humidity level, and the temperature inside the enclosure 206.

Figure 4:
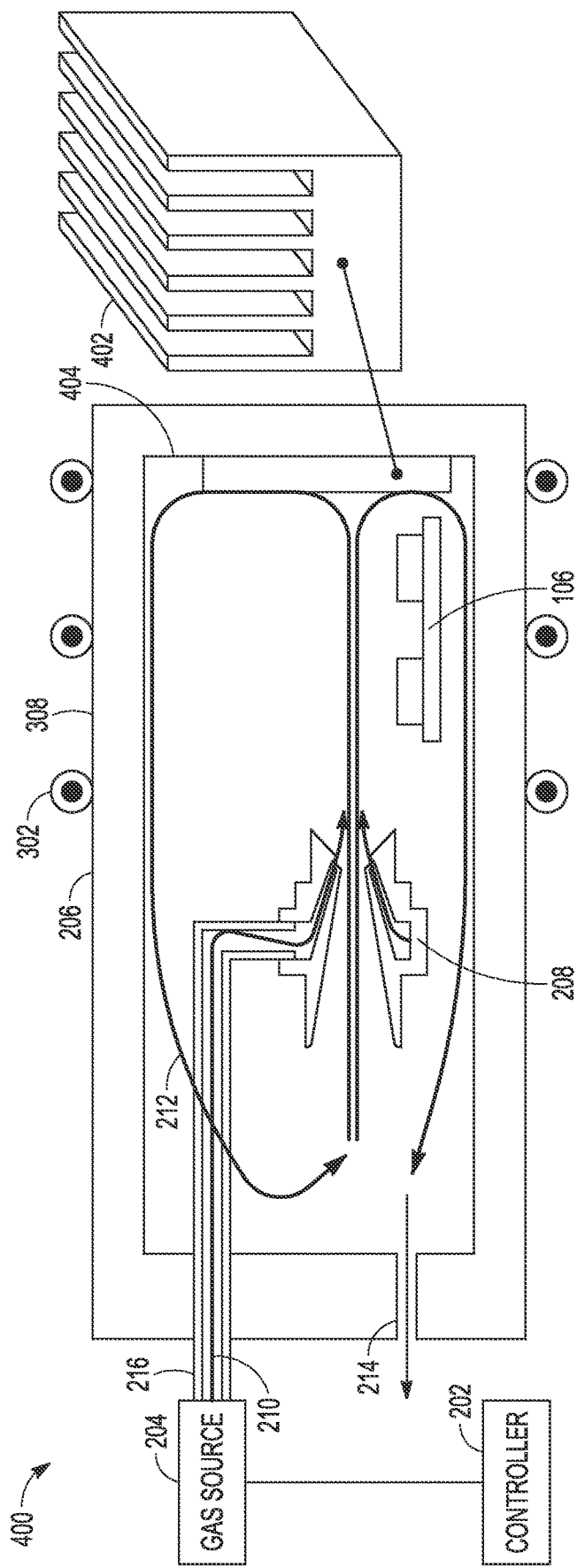
FIG. 4 is a block diagram illustrating an enclosure system in accordance with another example embodiment.

FIG. 4 is a block diagram illustrating an enclosure system 400 in accordance with another example embodiment. The enclosure system 400 comprises an electronic components 106, a controller 202, a gas source 204, an enclosure 206, an air amplifier 208, a first gas flow 210, an enhanced purge flow 212, an exhaust 214, a gas supply line 216, a heating/cooling elements 302, an outer wall 308, and a thermal fins 402.

The thermal fins 402 are thermally connected to an inner wall 404 of the enclosure 206. The addition of finned structures in the path of high velocity air increases heat transfer out of or into the enclosure 206.

Figure 5:
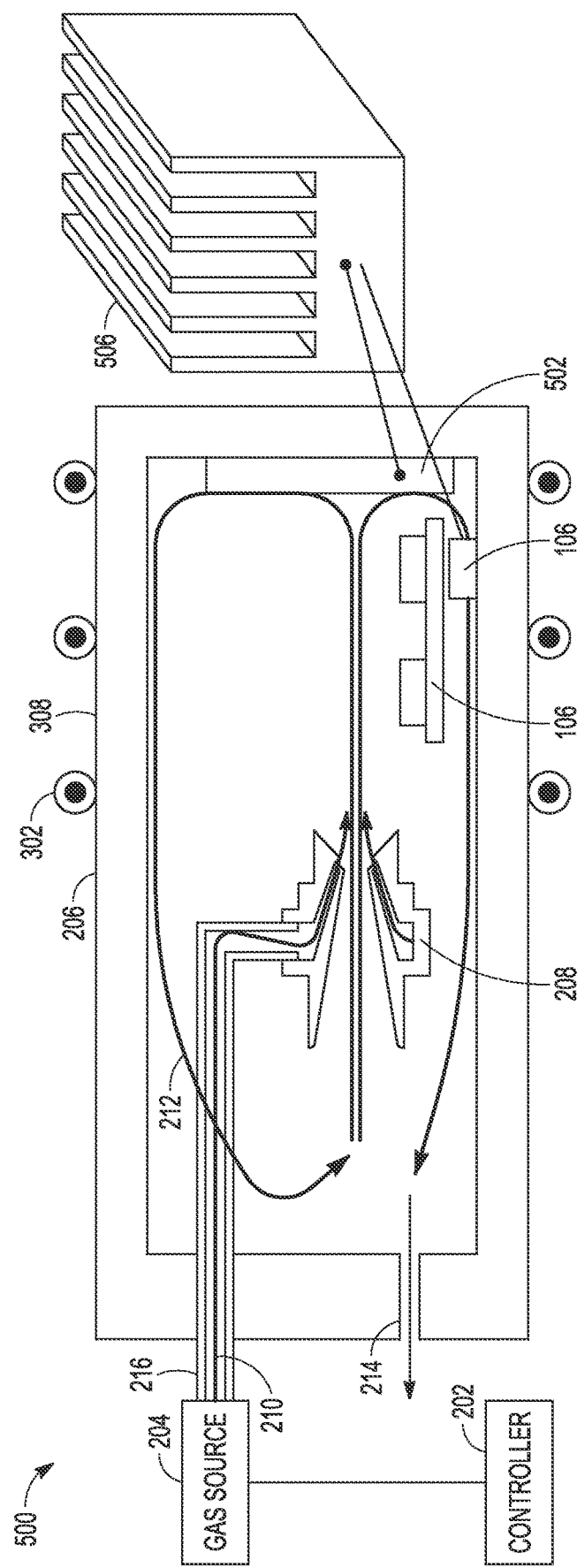
FIG. 5 is a block diagram illustrating an enclosure system in accordance with another example embodiment.

FIG. 5 is a block diagram illustrating an enclosure system 500 in accordance with another example embodiment. The enclosure system 500 comprises an electronic components 106, a controller 202, a gas source 204, an enclosure 206, an air amplifier 208, a first gas flow 210, an enhanced purge flow 212, an exhaust 214, a gas supply line 216, a heating/cooling elements 302, an outer wall 308, a thermal conductor 502, a thermal conductor 504, and thermal fins 506.

The thermal conductor 502 is thermally coupled to an inside wall of the enclosure 206. The thermal conductor 504 is thermally coupled to at least a portion of the electronic components 106. The thermal fins 506 illustrate an example of thermal conductor 502 and thermal conductor 504.

Figure 6:
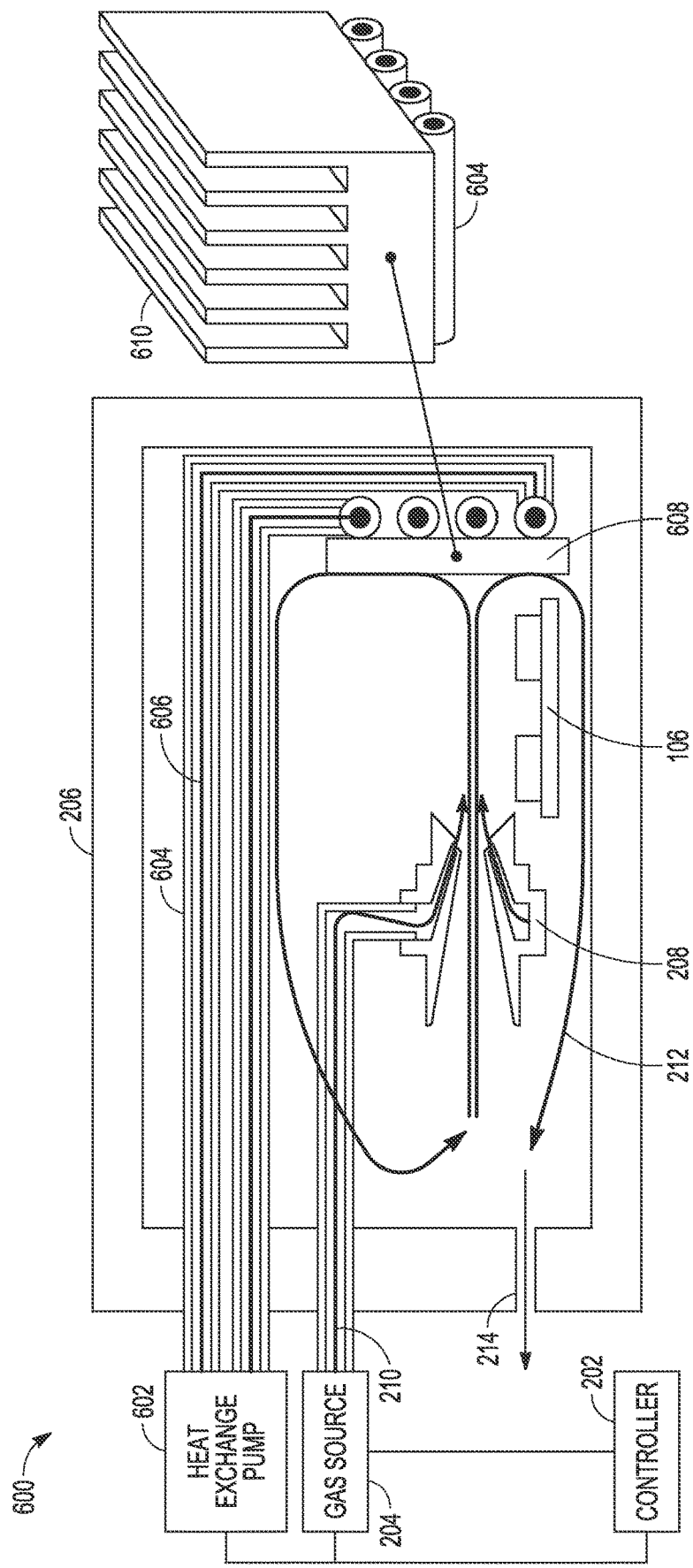
FIG. 6 is a block diagram illustrating an enclosure system in accordance with another example embodiment.

FIG. 6 is a block diagram illustrating an enclosure system 600 in accordance with another example embodiment. The enclosure 206 includes a finned heat sink 608 (that is not in thermal contact with the enclosure 206 or the electronic components 106). The finned heat sink 608 includes a finned thermal structure 610 and a cooling loop pipe 604 (including liquid coolant 606). The cooling loop pipe 604 is in thermal contact with the finned thermal structure 610. Air flow from the air amplifier 208 flow towards the finned heat sink 608. The liquid coolant 606 flowing inside the cooling loop pipe 604 transports the heat from the finned thermal structure 610 to outside the enclosure 206 via the cooling loop pipe 604 and the heat exchange pump 602. The heat exchange pump 602 pumps the liquid coolant 606 inside the cooling loop pipe 604.

The combination of the finned heat sink 608, cooling loop pipe 604, and air amplifier 208 provide effective gas flow cooling inside the enclosure 206 without using motorized fans and without using a large air/inert gas supply. The air amplifier 208 provides flow gain (e.g., 10× to 20×) that can be optimized in combination with a finned thermal structure 610 (and optionally liquid coolant 606 thermally connected to the finned thermal structure 610 of the finned heat sink 608).

Figure 7:
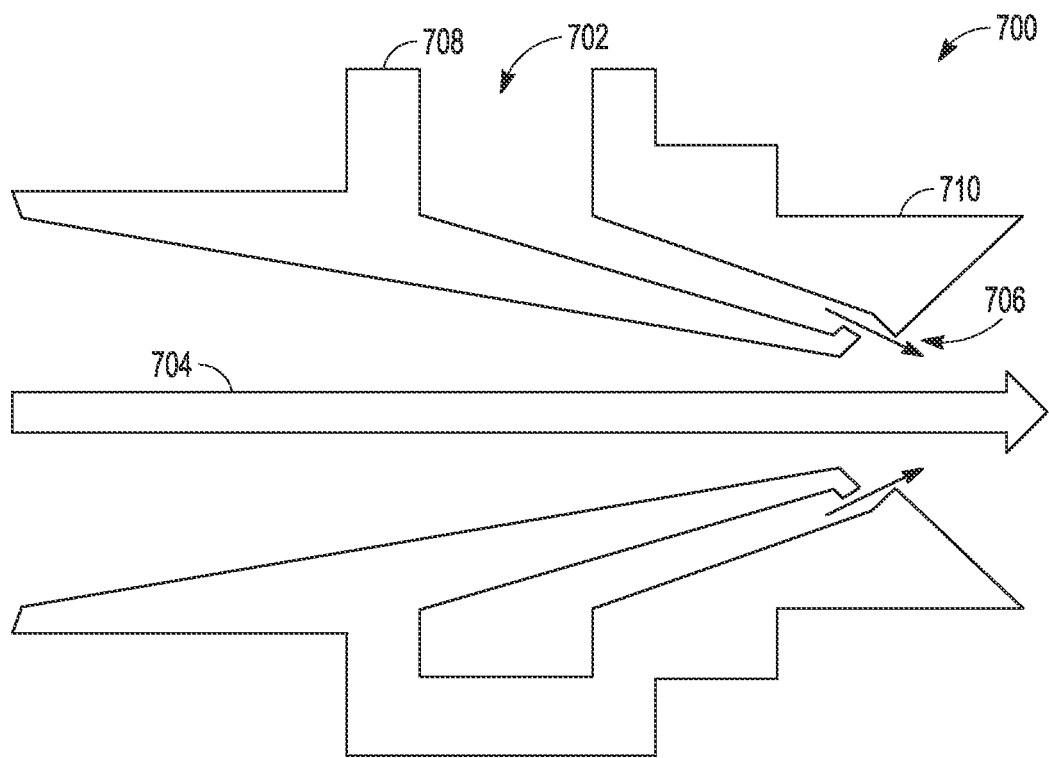
FIG. 7 is a block diagram depicting a cross-section of an example air amplifier, according to one example embodiment.

FIG. 7 is a block diagram depicting a cross-section of an example air amplifier 700, according to an example embodiment. A low velocity air flow 702 is supplied to an inlet 708 of the air amplifier 700. The air amplifier 700 amplifies ambient air 704 with the low velocity air flow 702 to produce a high velocity air flow 706 at the outlet 710.

Figure 8:
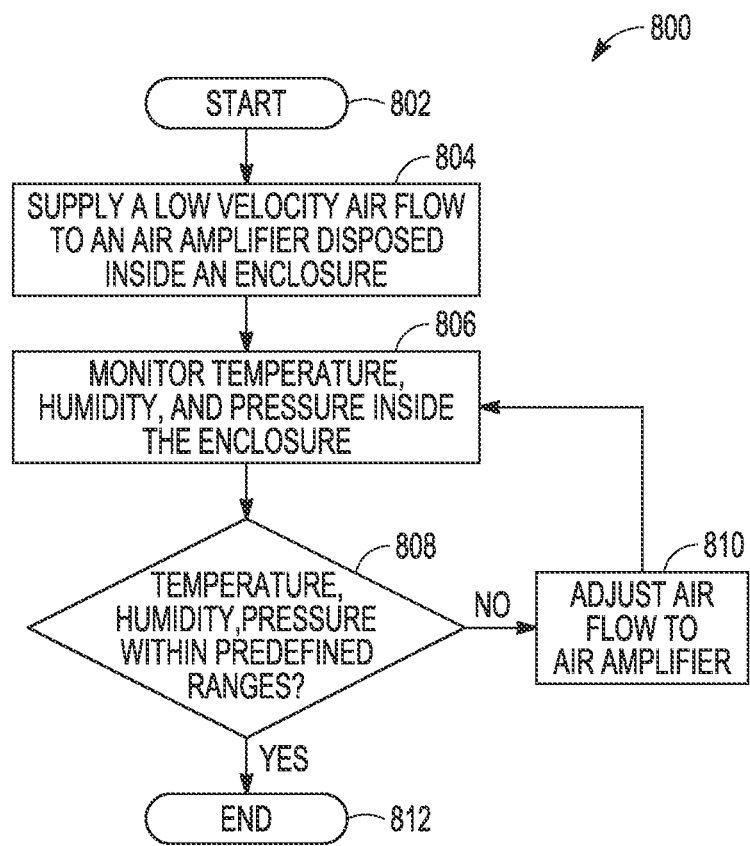
FIG. 8 is a flow diagram illustrating a method for controlling temperature in an enclosure in accordance with one example embodiment.

FIG. 8 is a flow diagram illustrating a method 800 for controlling temperature in an enclosure in accordance with one example embodiment. It is to be noted that other embodiments may use different sequencing, additional or fewer operations, and different nomenclature or terminology to accomplish similar functions. In some embodiments, various operations may be performed in parallel with other operations, either in a synchronous or asynchronous manner.

The operations described herein were chosen to illustrate some principles of operations in a simplified form.

The method 800 comprises a start block 802, a block 804, a block 806 a decision block 808, and an end block 812. At block 804, a gas source 204 supplies a low rate air flow to an air amplifier 208. The air amplifier 208 is placed inside the enclosure 206. At block 806, the controller 202 monitors the temperature, humidity, and pressure inside the enclosure 206. At decision block 808, the controller 202 determines whether one of the temperature, humidity, pressure levels are within predefined ranges. At block 810, the controller 202 adjusts the air flow to the air amplifier 208.

Figure 9:
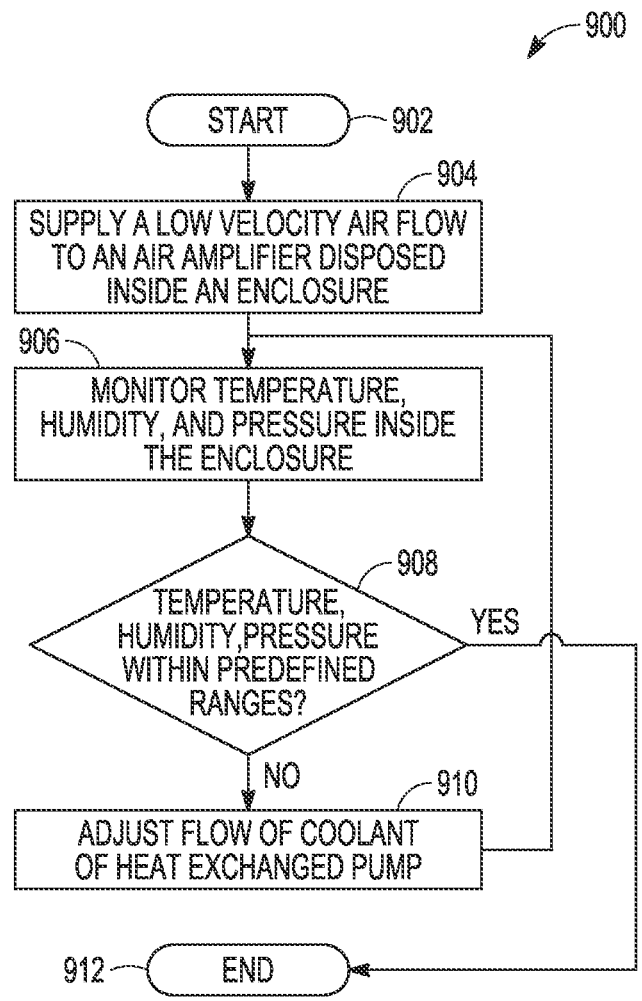
FIG. 9 is a flow diagram illustrating a method for controlling temperature in an enclosure in accordance with another example embodiment.

FIG. 9 is a flow diagram illustrating a method 900 for controlling temperature in an enclosure in accordance with one example embodiment. It is to be noted that other embodiments may use different sequencing, additional or fewer operations, and different nomenclature or terminology to accomplish similar functions. In some embodiments, various operations may be performed in parallel with other operations, either in a synchronous or asynchronous manner. The operations described herein were chosen to illustrate some principles of operations in a simplified form.

The method 900 comprises a start block 902, a block 904, a block 906, a decision block 908, a block 910, and an end block 912. At start block 902, a gas source 204 supplies a low velocity air flow to an air amplifier 208. The air amplifier 208 is placed inside the enclosure 206. At block 906, the controller 202 monitors the temperature, humidity, and pressure inside the enclosure 206. At decision block 908, the controller 202 determines whether one of the temperature, humidity, pressure levels are within predefined ranges. At block 910, the controller 202 adjusts the flow of coolant from the heat exchange pump.

Figure 10:
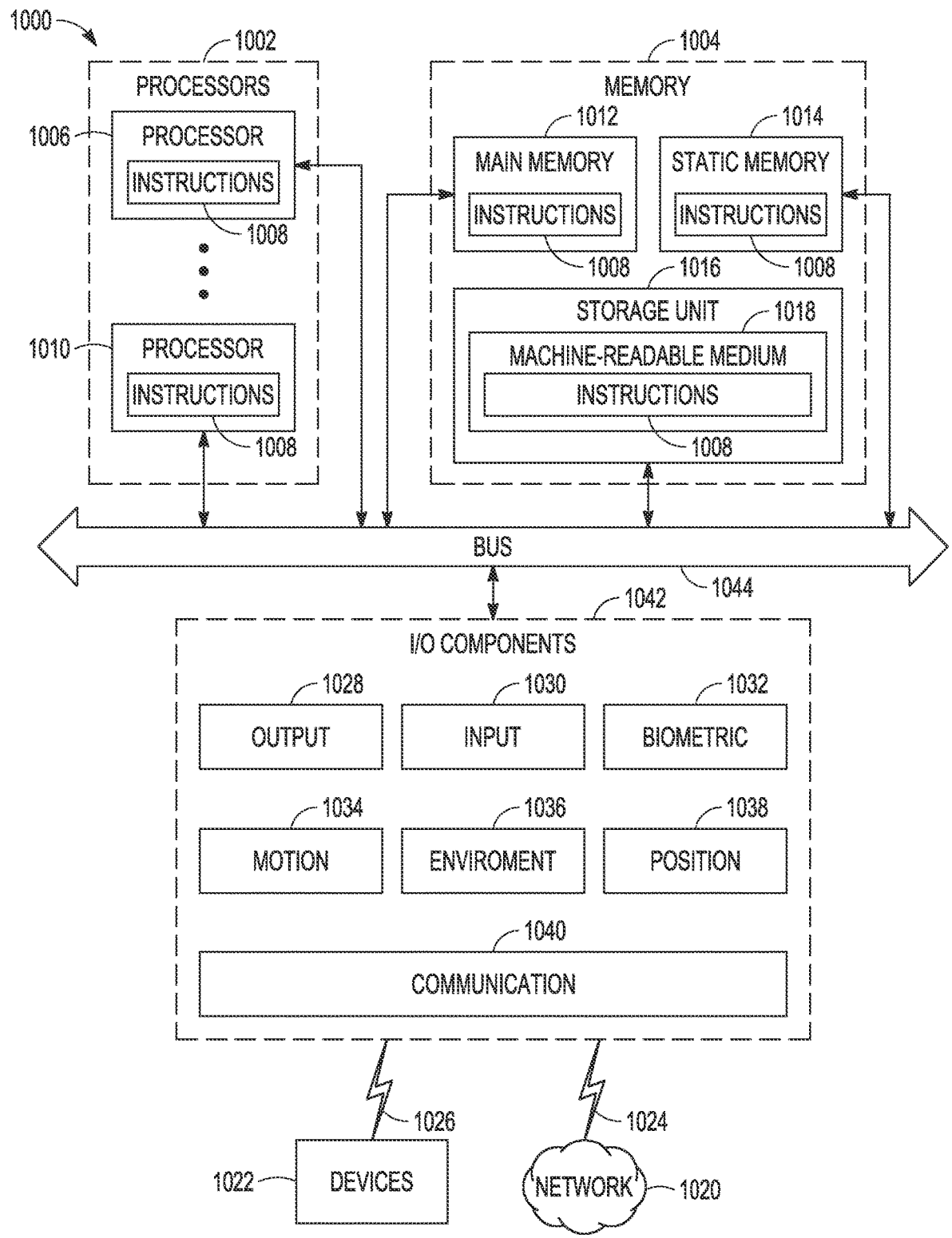
FIG. 10 is a diagrammatic representation of a machine in the form of a computer system within which a set of instructions may be executed for causing the machine to perform any one or more of the methodologies discussed herein, according to an example embodiment.

FIG. 10 is a diagrammatic representation of the machine 1000 within which instructions 1008 (e.g., software, a program, an application, an applet, an app, or other executable code) for causing the machine 1000 to perform any one or more of the methodologies discussed herein may be executed. For example, the instructions 1008 may cause the machine 1000 to execute any one or more of the methods described herein. The instructions 1008 transform the general, non-programmed machine 1000 into a particular machine 1000 programmed to carry out the described and illustrated functions in the manner described. The machine 1000 may operate as a standalone device or may be coupled (e.g., networked) to other machines. In a networked deployment, the machine 1000 may operate in the capacity of a server machine or a client machine in a server-client network environment, or as a peer machine in a peer-to-peer (or distributed) network environment. The machine 1000 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1008, sequentially or otherwise, that specify actions to be taken by the machine 1000. Further, while a single machine 1000 is illustrated, the term "machine" shall also be taken to include a collection of machines that individually or jointly execute the instructions 1008 to perform any one or more of the methodologies discussed herein.

The machine 1000 may include processors 1002, memory 1004, and I/O components 1042, which may be configured to communicate with each other via a bus 1044, In an example embodiment, the processors 1002 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RTIC), another processor, or any suitable combination thereof) may include, for example, a processor 1006 and a processor 1010 that execute the instructions 1008. The term "processor" is intended to include multi-core processors that may comprise two or more independent processors (sometimes referred to as "cores") that may execute instructions contemporaneously. Although FIG. 10 shows multiple processors 1002, the machine 1000 may include a single processor with a single core, a single processor with multiple cores (e.g., a multi-core processor), multiple processors with a single core, multiple processors with multiples cores, or any combination thereof.

The memory 1004 includes a main memory 1012, a static memory 1014, and a storage unit 1016, both accessible to the processors 1002 via the bus 1044. The main memory 1004, the static memory 1014, and storage unit 1016 store the instructions 1008 embodying any one or more of the methodologies or functions described herein. The instructions 1008 may also reside, completely or partially, within the main memory 1012, within the static memory 1014, within machine-readable medium 1018 within the storage unit 1016, within at least one of the processors 1002 within the processor's cache memory), or any suitable combination thereof, during execution thereof by the machine 1000.

The I/O components 1042 may include a wide variety of components to receive input, provide output, produce output, transmit information, exchange information, capture measurements, and so on. The specific I/O components 1042 that are included in a particular machine will depend on the type of machine. For example, portable machines such as mobile phones may include a touch input device or other such input mechanisms, while a headless server machine will likely not include such a touch input device. It will be appreciated that the I/O components 1042 may include many other components that are not shown in FIG. 10. In various example embodiments, the I/O components 1042 may include output components 1028 and input components 1030. The output components 1028 may include visual components e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 1030 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1042 may include biometric components 1032, motion components 1034, environmental components 1036, or position components 1038, among a wide array of other components. For example, the biometric components 1032 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 1034 include acceleration sensor components (e.g., accelerometer), gravitation sensor components, rotation sensor components (e.g., gyroscope), and so forth. The environmental components 1036 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1038 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1042 further include communication components 1040 operable to couple the machine 1000 to a network 1020 or devices 1022 via a coupling 1024 and a coupling 1026, respectively. For example, the communication components 1040 may include a network interface component or another suitable device to interface with the network 1020. In further examples, the communication components 1040 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1022 may be another machine or any of a wide variety of peripheral devices (e.g., a peripheral device coupled via a USB).

Moreover, the communication components 1040 may detect identifiers or include components operable to detect identifiers. For example, the communication components 1040 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1040, such as location via Internet Protocol (IP) geolocation, location via Wi-Fi® signal triangulation, location via detecting an NFC beacon signal that may indicate a particular location, and so forth.

The various memories (e.g., memory 1004, main memory 1012, static memory 1014, and/or memory of the processors 1002) and/or storage unit 1016 may store one or more sets of instructions and data structures (e.g., software) embodying or used by any one or more of the methodologies or functions described herein. These instructions (e.g., the instructions 1008), when executed by processors 1002, cause various operations to implement the disclosed embodiments.

The instructions 1008 may be transmitted or received over the network 1020, using a transmission medium, via a network interface device (e.g., a network interface component included in the communication components 1040) and using any one of a number of well-known transfer protocols (e.g., hypertext transfer protocol (HTTP)). Similarly, the instructions 1008 may be transmitted or received using a transmission medium via the coupling 1026 (e.g., a peer-to-peer coupling) to the devices 1022.

The description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be interrelated and each may be used separately or in combination with other particulate matter sensor calibration system embodiments discussed herein.

Consequently, many modifications and variations can be made, as will be apparent to the person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A temperature control system comprising:
an enclosure having an intake aperture and an exhaust aperture;
an air amplifier disposed inside the enclosure and having a first fluid path and a second fluid path, the first fluid path having an inlet area that is greater than an outlet area of the first fluid path, the second fluid inlet path having an inlet area that is greater than an outlet area of the second fluid path, a first fluid coupled to the first fluid path is configured to combine with a second fluid proximate to the outlet area of the first fluid path and the outlet area of the second fluid path, the air amplifier being configured to allow a larger mass flow of gas within the enclosure, than had incoming gas been allowed to pass directly into the enclosure, by drawing in surrounding gas; and
a gas supply line coupled to the air amplifier via the intake aperture and the first fluid path, the gas supply line configured to supply a first flow of the first fluid to the air amplifier, the air amplifier configured to amplify the first flow of the first fluid to a second flow of the second fluid inside the enclosure, thereby creating the larger mass flow of gas within the enclosure, at least a portion of the second flow of gas exiting through the exhaust aperture.

2. The temperature control system of claim 1, wherein the enclosure is configured to receive an electronic component to be disposed inside the enclosure, a temperature of the electronic component being based, in part, on a temperature of the second flow of gas.

3. The temperature control system of claim 2, further comprising:
a thermally conductive element thermally coupled to a portion of the electronic component.

4. The temperature control system of claim 1, further comprising:
a gas source coupled to the gas supply line, the gas source configured to supply the first flow of gas to the gas supply line; and
a controller coupled to the gas source, the controller configured to control a rate of the first flow of gas from the gas source to the air amplifier.

5. The temperature control system of claim 4, wherein the controller is configured to control the rate of the first flow of gas to purge the enclosure of contaminants.

6. The temperature control system of claim 1, further comprising a thermal conductive element having a plurality of fins disposed in a direction along a path of the second flow of gas.

7. The temperature control system of claim 1, further comprising:
a heat exchange pump coupled to a closed loop pipe partially disposed inside the enclosure, the heat exchange pump configured to circulate a thermally conductive liquid in the closed loop pipe; and
a thermal conductive element disposed inside the enclosure, the thermally conductive element thermally coupled to a portion of the closed loop pipe.

8. The temperature control system of claim 7, further comprising:
a gas source coupled to the gas supply line, the gas source configured to supply the first flow of gas to the gas supply line; and
a controller coupled to the gas source and the heat exchange pump, the controller configured to adjust a rate of the first flow of gas from the gas source, and a flow rate of the thermally conductive liquid in the closed loop pipe.

9. The temperature control system of claim 8, further comprising:
a pressure sensor disposed inside the enclosure, the pressure sensor configured to measure a pressure inside the enclosure;
a temperature sensor coupled to an electronic component, the temperature sensor configured to measure a temperature of the electronic component disposed inside the enclosure; and
a humidity sensor disposed inside the enclosure, the humidity sensor configured to measure a humidity level inside the enclosure,
wherein the controller is coupled to at least one of the pressure sensor, the temperature sensor, or the humidity sensor, the controller configured to adjust at least one of the rate of the first flow of gas from the gas source or the flow of the thermally conductive liquid in the closed loop pipe based on at least one of the pressure inside the enclosure, the temperature of the electronic component, or the humidity level inside the enclosure.

10. The temperature control system of claim 9, wherein the controller increases the rate of the first flow of gas when the humidity detected by the humidity sensor is greater than a predetermined threshold.

11. A method comprising:
supplying, via a gas supply line, a first flow of gas to an air amplifier that is disposed inside an enclosure having an intake aperture and an exhaust aperture, the air amplifier having a first fluid path and a second fluid path, the first fluid path having an inlet area that is greater than an outlet area of the first fluid path, the second fluid inlet path having an inlet area that is greater than an outlet area of the second fluid path;
combining a first fluid coupled to the first fluid path with a second fluid proximate to the outlet area of the first fluid path and at the outlet area of the second fluid path;
allowing a larger mass flow of gas, through the air amplifier, within the enclosure than had incoming gas been allowed to pass directly into the enclosure by drawing in surrounding gas, the air amplifier being configured to amplify the first flow of gas to a second flow of gas inside the enclosure, thereby creating the larger mass flow of gas within the enclosure; and
exhausting the second flow of gas exiting through the exhaust aperture.

12. The method of claim 11, further comprising:
placing an electronic component inside the enclosure, a temperature of the electronic component being based on a temperature of the second flow of gas.

13. The method of claim 12, further comprising:
thermally coupling a thermal conductive element to a portion of the electronic component.

14. The method of claim 11, further comprising:
supplying the first flow of gas via the gas supply line from a gas source to the air amplifier; and
controlling a rate of the first flow of gas from the gas source.

15. The method of claim 11, further comprising:
thermally coupling a thermally conductive element to an outer wall of the enclosure, or an inner wall of the enclosure.

16. The method of claim 15, wherein the thermal conductive element comprises a plurality of fins disposed in a direction along a path of the second flow of gas.

17. The method of claim 11, further comprising:
circulating a thermally conductive liquid inside a closed loop pipe that is coupled to a heat exchange pump, the closed loop pipe being partially disposed inside the enclosure,
wherein a thermal conductive element is disposed inside the enclosure, the thermally conductive element thermally coupled to a portion of the closed loop pipe.

18. The method of claim 17, further comprising:
supplying the first flow of gas from a gas source to the gas supply line; and
adjusting a rate of the first flow of gas from the gas source, and a flow of the thermally conductive liquid in the closed loop pipe.

19. The method of claim 18, further comprising:
measuring a pressure inside the enclosure with a pressure sensor disposed inside the enclosure;
measuring a temperature of an electronic component disposed inside the enclosure with a temperature sensor coupled to the electronic component;
measuring a humidity level inside the enclosure with a humidity sensor disposed inside the enclosure; and
adjusting at least one of the rate of the first flow of gas from the gas source or the flow of the thermally conductive liquid in the closed loop pipe based on at least one of the pressure inside the enclosure, the temperature of the electronic component, or the humidity level inside the enclosure.

20. A computer-readable storage medium, the computer-readable storage medium including instructions that when executed by a computer, cause the computer to perform operations comprising:
controlling a supply a first flow of gas to an air amplifier that is disposed inside an enclosure having an intake aperture and an exhaust aperture, the air amplifier having a first fluid path and a second fluid path, the first fluid path having an inlet area that is greater than an outlet area of the first fluid path, the second fluid inlet path having an inlet area that is greater than an outlet area of the second fluid path, the air amplifier thereby allowing a larger mass flow of gas within the enclosure than had incoming gas been allowed to pass directly into the enclosure by drawing in surrounding gas, the air amplifier being configured to amplify the first flow of gas to a second flow of gas inside the enclosure, thereby creating the larger mass flow of gas within the enclosure;
combining a first fluid coupled to the first fluid path with a second fluid proximate to the outlet area of the first fluid path and at the outlet area of the second fluid path;
measuring a pressure inside the enclosure with a pressure sensor disposed inside the enclosure;
measuring a temperature of an electronic component disposed inside the enclosure with a temperature sensor coupled to the electronic component;
measuring a humidity level inside the enclosure with a humidity sensor disposed inside the enclosure; and
adjusting at least one of a rate of the first flow of gas from a gas source based on at least one of the pressure inside the enclosure, the temperature of the electronic component, or the humidity level inside the enclosure.

* * * * *